United States Patent
Kuo et al.

(10) Patent No.: US 9,252,332 B1
(45) Date of Patent: Feb. 2, 2016

(54) LIGHT EMITTING DIODE STRUCTURE AND LIGHT EMITTING DIODE MODULE

(71) Applicant: Lextar Electronics Corporation, Hsinchu (TW)

(72) Inventors: Shiou-Yi Kuo, Kaohsiung (TW); Te-Chung Wang, Taichung (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 14/706,266

(22) Filed: May 7, 2015

(30) Foreign Application Priority Data

Nov. 18, 2014 (TW) .............................. 103139927 A

(51) Int. Cl.
*H01L 33/00* (2010.01)
*H01L 33/38* (2010.01)
*H01L 25/075* (2006.01)
*H01L 33/08* (2010.01)
*H01L 33/24* (2010.01)
*H01L 33/46* (2010.01)
*H01L 33/62* (2010.01)

(52) U.S. Cl.
CPC ............ *H01L 33/38* (2013.01); *H01L 25/0753* (2013.01); *H01L 33/08* (2013.01); *H01L 33/24* (2013.01); *H01L 33/46* (2013.01); *H01L 33/62* (2013.01)

(58) Field of Classification Search
CPC .......................... H01L 25/0753; H01L 33/387
See application file for complete search history.

(56) References Cited

U.S. PATENT DOCUMENTS

| | | | |
|---|---|---|---|
| 2010/0155746 A1* | 6/2010 | Ibbetson | H01L 25/0753 257/88 |
| 2011/0233587 A1* | 9/2011 | Unno | H01L 33/382 257/98 |
| 2012/0018764 A1* | 1/2012 | Choi | H01L 33/20 257/99 |
| 2013/0049008 A1* | 2/2013 | Jeong | H01L 25/0753 257/76 |
| 2015/0206922 A1* | 7/2015 | Kawai | H01L 33/08 257/91 |

* cited by examiner

*Primary Examiner* — Daniel Whalen
(74) *Attorney, Agent, or Firm* — Hayes Soloway, PC

(57) ABSTRACT

A light emitting diode structure includes a first contact electrode, a first insulating layer, a second contact electrode, a second insulating layer, a first barrier layer, a second barrier layer, a first illuminant epitaxial structure, and a second illuminant epitaxial structure. The first contact electrode includes a first protruding portion. The first insulating layer covers the first contact electrode and exposes a top of the first protruding portion. The second contact electrode is located on the first insulating layer and includes a second protruding portion. The second insulating layer covers the second contact electrode and exposes a top of the second protruding portion. The first barrier layer is located on the second insulating layer and is electrically connected to the second contact electrode. The second barrier layer is located on the second insulating layer.

10 Claims, 5 Drawing Sheets

LIGHT EMITTING DIODE STRUCTURE AND LIGHT EMITTING DIODE MODULE

RELATED APPLICATIONS

This application claims priority to Taiwanese Application Serial Number 103139927, filed Nov. 18, 2014, which is herein incorporated by reference.

BACKGROUND

1. Technical Field

The present disclosure relates to a light emitting diode structure.

2. Description of Related Art

Light emitting diodes become more widely used in products. In applications of signal sources, indicator lights, LCD backlights, lighting, and projectors, light emitting diodes have gradually replaced traditional light bulbs. The currents required by these products are increased with the increasing usage demands of consumers. Therefore, manufacturers may electrically connect the light emitting diodes in series or in parallel to improve the luminous power of the light emitting diodes.

A conventional way of electrically connecting the light emitting diodes in series or in parallel is wire-bonding process. However, the wire-bonding process has a risk of failure. The wire-boning process may cause various product defects, such as peeling, breaking, etc.

Hence, how to provide a light emitting diode structure electrically connected in series or in parallel without using the wire-bonding process becomes an important issue in the industry.

SUMMARY

Accordingly, an aspect of the disclosure is to provide a light emitting diode structure. The light emitting diode structure includes a first contact electrode, a first insulating layer, a second contact electrode, a second insulating layer, a first barrier layer, a second barrier layer, a first illuminant epitaxial structure, and a second illuminant epitaxial structure. The first contact electrode includes a first protruding portion. The first insulating layer covers the first contact electrode and exposes a top of the first protruding portion. The second contact electrode is located on the first insulating layer and includes a second protruding portion. The second insulating layer covers the second contact electrode and exposes a top of the second protruding portion. The first barrier layer is located on the second insulating layer and electrically connected to the second contact electrode. The second barrier layer is located on the second insulating layer. The first illuminant epitaxial structure is located on the second insulating layer and includes a first P-type semiconductor layer, a first light emitting layer, and a first N-type semiconductor layer. The first P-type semiconductor layer covers the first barrier layer. The first light emitting layer and the first N-type semiconductor layer are sequentially stacked on the first P-type semiconductor layer. A portion of the first insulating layer passes through the first P-type semiconductor layer and the first light emitting layer, such that the top of the first protruding portion is located in the first N-type semiconductor layer. The second illuminant epitaxial structure is located on the second insulating layer and includes a second P-type semiconductor layer, a second light emitting layer, and a second N-type semiconductor layer. The second P-type semiconductor layer covers a portion of the second barrier layer. The second light emitting layer and the second N-type semiconductor layer are sequentially stacked on the second P-type semiconductor layer. A portion of the second insulating layer passes through the second P-type semiconductor layer and the second light emitting layer, such that the top of the second protruding portion is located in the second N-type semiconductor layer.

In an embodiment of the disclosure, the light emitting diode structure further includes a substrate and a metal bonding layer. The metal bonding layer is located between the substrate and the first contact electrode.

In an embodiment of the disclosure, the light emitting diode structure further includes a first reflective layer and a second reflective layer. The first reflective layer is located between the first barrier layer and the first illuminant epitaxial structure. The second reflective layer is located between the second barrier layer and the second illuminant epitaxial structure.

In an embodiment of the disclosure, the light emitting diode structure further includes a first transparent conductive layer and a second transparent conductive layer. The first transparent conductive layer is located between the first reflective layer and the first illuminant epitaxial structure. The second transparent conductive layer is located between the second reflective layer and the second illuminant epitaxial structure.

In an embodiment of the disclosure, the first N-type semiconductor layer has a first light emitting surface away from the first light emitting layer. The second N-type semiconductor layer has a second light emitting surface away from the second light emitting layer. The first light emitting surface and the second light emitting surface are uneven surfaces.

In an embodiment of the disclosure, the light emitting diode structure further includes a first isolation layer and a second isolation layer. The first illuminant epitaxial structure has a first channel passing through the first P-type semiconductor layer and the first light emitting layer. The first isolation layer entirely covers an inner sidewall of the first channel. The second illuminant epitaxial structure has a second channel passing through the second P-type semiconductor layer and the second light emitting layer. The second isolation layer entirely covers an inner sidewall of the second channel.

In an embodiment of the disclosure, the light emitting diode structure further includes a first bonding pad. The second barrier layer further includes an extending portion. The first bonding pad is electrically connected to and located on the extending portion.

In an embodiment of the disclosure, the light emitting diode structure further includes a protective layer. The protective layer covers the first illuminant epitaxial structure, the second illuminant epitaxial structure, and the second barrier layer and exposes at least one portion of the first bonding pad.

In an embodiment of the application, the light emitting diode structure further includes a first bonding pad and a second bonding pad. The second barrier layer further includes an extending portion. The first bonding pad is electrically connected to and located on the extending portion. The second bonding pad is electrically connected to and located on the first contact electrode.

The disclosure further provides a light emitting diode module. The light emitting diode module includes a plurality of light emitting diode structures. The second barrier layers of the light emitting diode structures are connected to each other, such that the light emitting diode structures form a parallel connection structure.

Accordingly, the light emitting diode structures of the aforementioned embodiments can avoid the risk caused by the wire-bonding process and improve production yields. The light emitting diode module can further achieve a good output power to meet demands of consumers.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
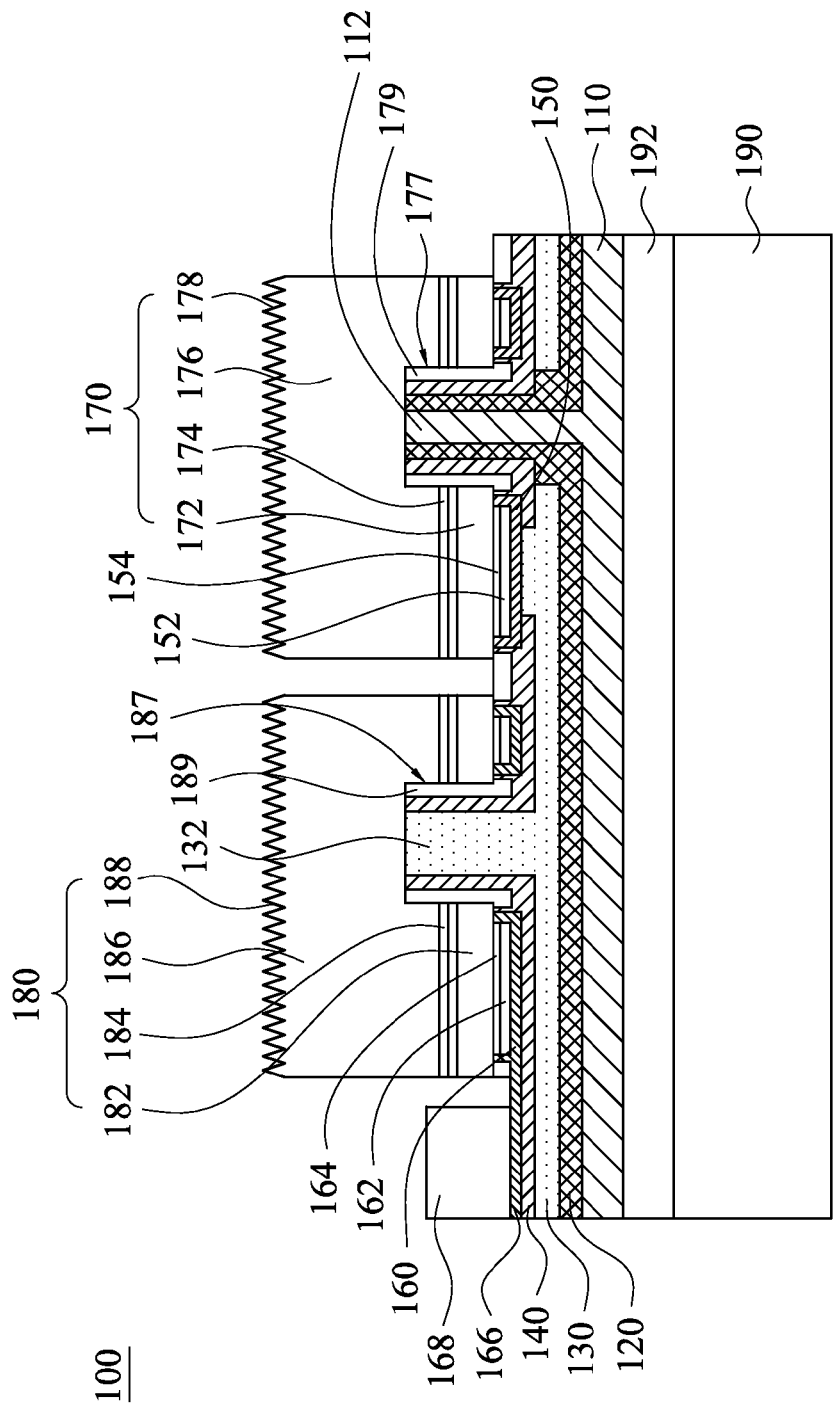
FIG. 1 is a schematic cross-sectional view of a light emitting diode structure according to an embodiment of the disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a schematic cross-sectional view of a light emitting diode structure 100 according to an embodiment of the disclosure.

As shown in FIG. 1, in the embodiment, the light emitting diode structure 100 includes a first contact electrode 110, a first insulating layer 120, a second contact electrode 130, a second insulating layer 140, a first barrier layer 150, a second barrier layer 160, a first illuminant epitaxial structure 170, and a second illuminant epitaxial structure 180. The first contact electrode 110 includes a first protruding portion 112. The first insulating layer 120 covers the first contact electrode 110 and exposes a top of the first protruding portion 112. The second contact electrode 130 is located on the first insulating layer 120 and includes a second protruding portion 132. The second insulating layer 140 covers the second contact electrode 130 and exposes a top of the second protruding portion 132. The first barrier layer 150 is located on the second insulating layer 140 and electrically connected to the second contact electrode 130. The second barrier layer 160 is located on the second insulating layer 140. In the embodiment, the first barrier layer 150 and the second barrier layer 160 are conductors and can effectively prevent the diffusion phenomenon of metal (e.g., silver) during a process. The materials forming the first barrier layer 150 and the second barrier layer 160 includes chromium, platinum, molybdenum, niobium, palladium, titanium, tungsten, or alloys thereof.

It is notable that the aforementioned materials of the first barrier layer 150 and the second barrier layer 160 are merely examples for explanation, but the disclosure is not limited in this regard. One having ordinary skills in the art can choose appropriate materials depending on actual requirements.

As shown in FIG. 1, in the embodiment, the first illuminant epitaxial structure 170 is located on the second insulating layer 140 and includes a first P-type semiconductor layer 172, a first light emitting layer 174, and a first N-type semiconductor layer 176. The first P-type semiconductor layer 172 covers the first barrier layer 150. The first light emitting layer 174 and the first N-type semiconductor layer 176 are sequentially stacked on the first P-type semiconductor layer 172. A portion of the first insulating layer 120 passes through the first P-type semiconductor layer 172 and the first light emitting layer 174, such that the top of the first protruding portion 112 is located in the first N-type semiconductor layer 176. The second illuminant epitaxial structure 180 is located on the second insulating layer 140 and includes a second P-type semiconductor layer 182, a second light emitting layer 184, and a second N-type semiconductor layer 186. The second P-type semiconductor layer 182 covers a portion of the second barrier layer 160. The second light emitting layer 184 and the second N-type semiconductor layer 186 are sequentially stacked on the second P-type semiconductor layer 182. A portion of the second insulating layer 140 passes through the second P-type semiconductor layer 182 and the second light emitting layer 184, such that the top of the second protruding portion 132 is located in the second N-type semiconductor layer 186.

With the structural configuration of the light emitting diode structure 100, if a current is applied to the second barrier layer 160, the current will sequentially flow through the second illuminant epitaxial structure 180, the second contact electrode 130, the first barrier layer 150, the first illuminant epitaxial structure 170, and then flow out from the first contact electrode 110. In other words, the first illuminant epitaxial structure 170 and the second illuminant epitaxial structure 180 form a series connection structure without using the conventional wire-bonding process. Hence, the light emitting diode structure 100 of the embodiment can avoid the risk caused by the wire-bonding process and improves production yields.

In general, the moving speed of carriers in a P-type semiconductor is slower than the moving speed of carriers in a N-type semiconductor. In other words, the conductivity of the P-type semiconductor is worse than that of the N-type semiconductor. Therefore, in the embodiment, the first barrier layer 150 and the second barrier layer 160 are electrically connected to the first P-type semiconductor layer 172 and the second P-type semiconductor layer 182 respectively with large contact areas, so that the current flowing through the first P-type semiconductor layer 172 and the second P-type semiconductor layer 182 can be smoother and more uniform.

As shown in FIG. 1, in the embodiment, the light emitting diode structure 100 further includes a substrate 190 and a metal bonding layer 192. The metal bonding layer 192 is located between the substrate 190 and the first contact electrode 110. The metal bonding layer 192 is configured to bond the first contact electrode 110 and the substrate 190. The substrate 190 is configured to be electrically connected to a leadframe (not shown). The current flowing out of the first contact electrode 110 flows to a circuit board (not shown) via the metal bonding layer 192, the substrate 190, and then the leadframe.

As shown in FIG. 1, in the embodiment, the light emitting diode structure 100 further includes a first reflective layer 152 and a second reflective layer 162. The first reflective layer 152 is located between the first barrier layer 150 and the first illuminant epitaxial structure 170. The second reflective layer 162 is located between the second barrier layer 160 and the second illuminant epitaxial structure 180. The first reflective layer 152 and the second reflective layer 162 are configured to reflect the light emitted from the first light emitting layer 174 and the second light emitting layer 184, respectively.

The materials forming the first reflective layer 152 and the second reflective layer 162 includes gold, aluminum, rhodium, silver, nickel, chromium, or alloys thereof. It is noted that the aforementioned materials forming the first reflective layer 152 and the second reflective layer 162 are merely examples for explanation, but the disclosure is not limited in this regard. One having ordinary skills in the art can choose appropriate materials depending on actual requirements.

It is notable that some materials (e.g., silver) used in the first reflective layer 152 and the second reflective layer 162 are easy to diffuse. Therefore, in the embodiment, the first barrier layer 150 and the second barrier layer 160 respectively surround the first reflective layer 152 and the second reflective layer 162, so as to avoid the first reflective layer 152 and the second reflective layer 162 to the diffusion phenomenon.

As shown in FIG. 1, in the embodiment, the light emitting diode structure 100 further includes a first transparent conductive layer 154 and a second transparent conductive layer 164. The first transparent conductive layer 154 is located between the first reflective layer 152 and the first illuminant epitaxial structure 170. The second transparent conductive layer 164 is located between the second reflective layer 162 and the second illuminant epitaxial structure 180. The first transparent conductive layer 154 and the second transparent conductive layer 164 are configured to prevent the first reflective layer 152 and the second reflective layer 162 from diffusing into the first illuminant epitaxial structure 170 and the second illuminant epitaxial structure 180.

The materials forming the first transparent conductive layer 154 and the second transparent conductive layer 164 include indium tin oxide, zinc aluminum oxide, zinc oxide, aluminum gallium, indium gallium zinc oxide, or a thin metal. It is noted that the aforementioned materials forming the first transparent conductive layer 154 and the second transparent conductive layer 164 are merely examples for explanation, but the disclosure is not limited in this regard. One having ordinary skills in the art can choose appropriate materials depending on actual requirements.

As shown in FIG. 1, in the embodiment, the first N-type semiconductor layer 176 has a first light emitting surface 178 away from the first light emitting layer 174. The second N-type semiconductor layer 186 has a second light emitting surface 188 away from the second light emitting layer 184. The first light emitting surface 178 and the second light emitting surface 188 are uneven surfaces, that is, roughened surfaces. Therefore, the first light emitting surface 178 and the second light emitting surface 188 have good light transmittances.

As shown in FIG. 1, in the embodiment, the light emitting diode structure 100 further includes a first isolation layer 179 and a second isolation layer 189 configured to prevent a portion of the first reflective layer 152 and a portion of the second reflective layer 162 (e.g., silver) from diffusing into the first illuminant epitaxial structure 170 and the second illuminant epitaxial structure 180. Particularly, the first illuminant epitaxial structure 170 has a first channel 177 passing through the first P-type semiconductor layer 172 and the first light emitting layer 174. The first isolation layer 179 entirely covers an inner sidewall of the first channel 177. The second illuminant epitaxial structure 180 has a second channel 187 passing through the second P-type semiconductor layer 182 and the second light emitting layer 184. The second isolation layer 189 entirely covers an inner sidewall of the second channel 187.

Furthermore, in the manufacturing process of the light emitting diode structure 100, after the first illuminant epitaxial structure 170 and the second illuminant epitaxial structure 180 are fully grown, the first channel 177 and the second channel 187 are formed by etching. If the first channel 177 and the second channel 187 are not protected, a portion of the first reflective layer 152 and a portion of the second reflective layer 162 may respectively diffuse into the first illuminant epitaxial structure 170 and the second illuminant epitaxial structure 180 via the first channel 177 and the second channel 187 when the first reflective layer 152 and the second reflective layer 162 are grown, and thus electrical properties of the light emitting diode structure 100 will be affected. Therefore, in the embodiment, after first channel 177 and the second channel 187 are formed by etching, the first isolation layer 179 and the second isolation layer 189 are deposited to protect the light emitting diode structure 100.

As shown in FIG. 1, in the embodiment, the light emitting diode structure 100 further includes a first bonding pad 168. The second barrier layer 160 further includes an extending portion 166. The first bonding pad 168 is electrically connected to and located on the extending portion 166. The first bonding pad 168 is configured to be electrically connected a wire (not shown) during a wire-bonding process. The wire also can be electrically connected to the extending portion 166 of the second barrier layer 160 directly. However, the structure of the first bonding pad 168 is stronger, so that the wire electrically connected to the first bonding pad 168 can improve the production yields.

It should be understood that other embodiments of the light emitting diode structure 100 are described below, and the connection relationships among the aforementioned components and the materials forming the aforementioned components are not described again hereinafter.

Figure 2:
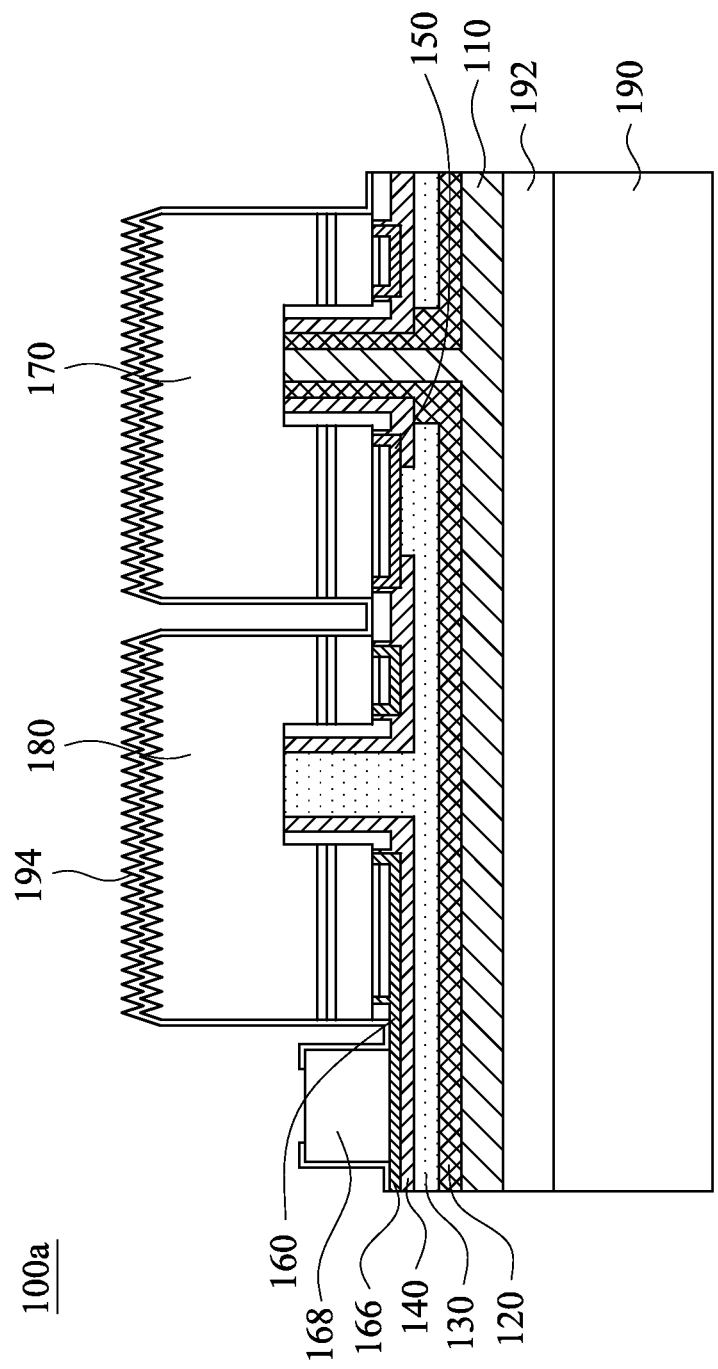
FIG. 2 is a schematic cross-sectional view of a light emitting diode structure according to another embodiment of the disclosure.

FIG. 2 is a schematic cross-sectional view of a light emitting diode structure 100a according to another embodiment of the disclosure.

As shown in FIG. 2, compared with the embodiment in FIG. 1, the light emitting diode structure 100a of the present embodiment further includes a protective layer 194. The protective layer 194 covers the first illuminant epitaxial structure 170, the second illuminant epitaxial structure 180, and the second barrier layer 160, and exposes at least a portion of the first bonding pad 168 configured to be electrically connected a wire (not shown). The protective layer 194 can effectively prevent any kind of pollution (e.g., moisture) from entering the light emitting diode structure 100a.

Figure 3:
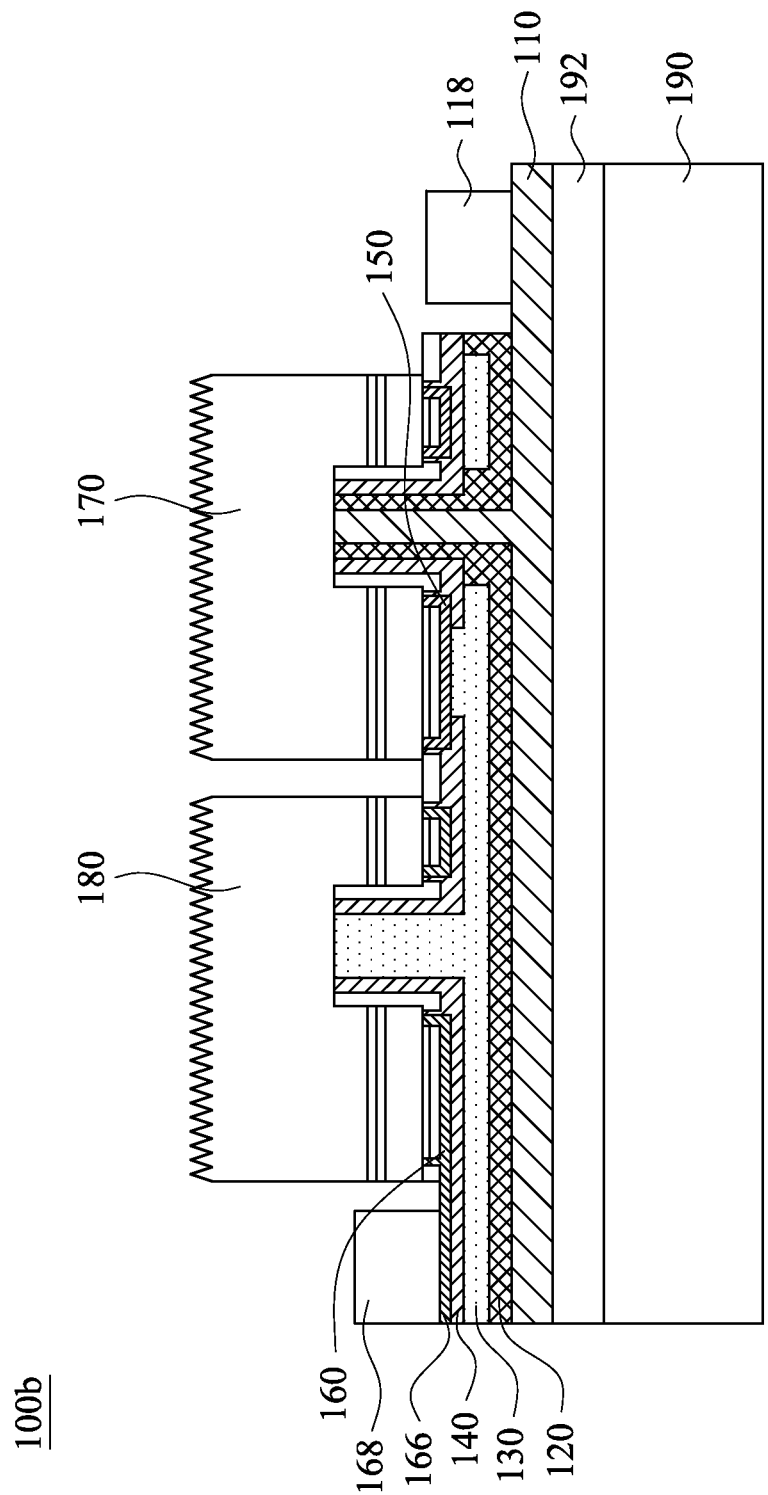
FIG. 3 is a schematic cross-sectional view of a light emitting diode structure according to another embodiment of the disclosure.

FIG. 3 is a schematic cross-sectional view of a light emitting diode structure 100b according to another embodiment of the disclosure.

As shown in FIG. 3, compared with the embodiment in FIG. 1, the light emitting diode structure 100b of the present embodiment further includes a first bonding pad 168 and a second bonding pad 118. The second barrier layer 160 further includes an extending portion 166. The first bonding pad 168 is electrically connected to and located on the extending portion 166. The second bonding pad 118 is electrically connected to and located on the first contact electrode 110.

In general, a current flowing into the first bonding pad 168 sequentially flows through the second illuminant epitaxial structure 180 and the first illuminant epitaxial structure 170, and eventually flows out from the substrate 190. Therefore, the substrate 190 and a leadframe (not shown) are electrically connected. However, in the embodiment, the light emitting diode structure 100b is electrically connected to the leadframe via the second bonding pad 118, so as to avoid the position alignment problem when the light emitting diode structure 100b is welded to the leadframe.

Figure 4:
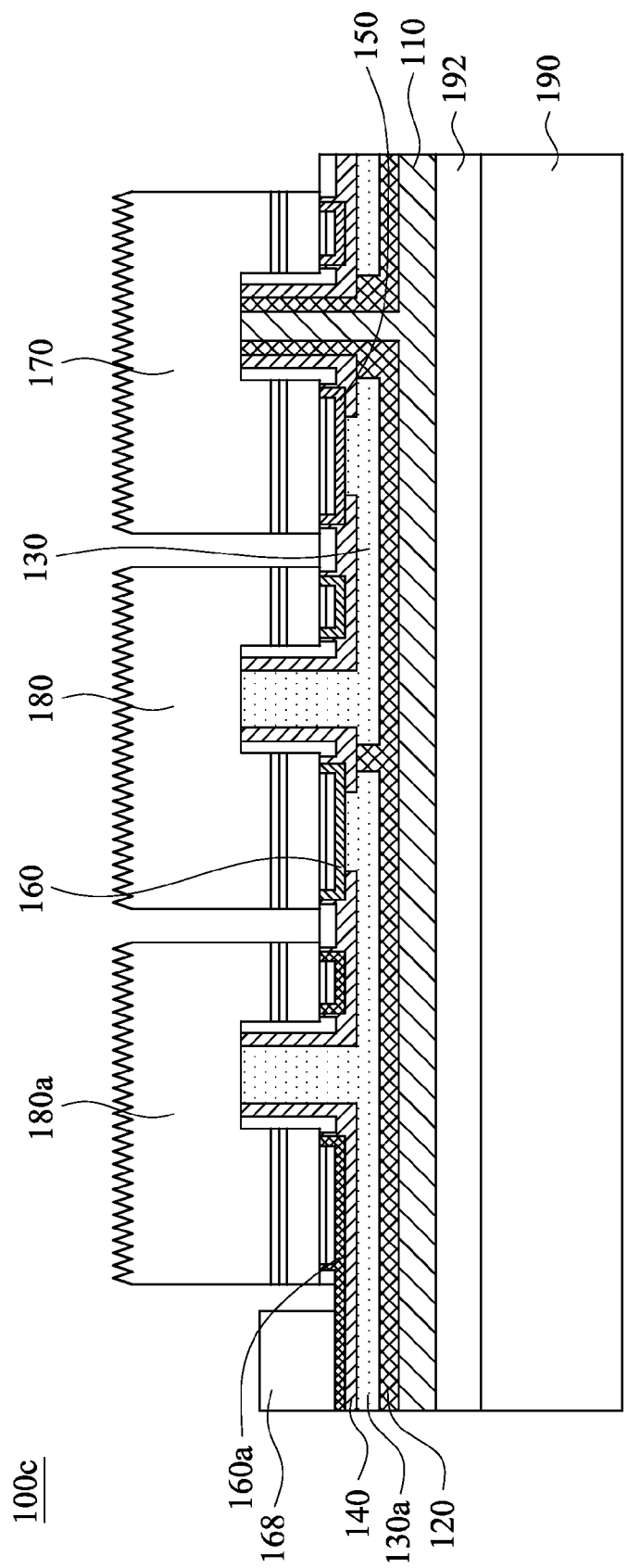
FIG. 4 is a schematic cross-sectional view of a light emitting diode structure according to another embodiment of the disclosure.

FIG. 4 is a schematic cross-sectional view of a light emitting diode structure 100c according to another embodiment of the disclosure.

As shown in FIG. 4, compared with the embodiment in FIG. 1, the light emitting diode structure 100c of the present embodiment further includes a third illuminant epitaxial structure 180a, a third barrier layer 160a, and a third contact electrode 130a. The third barrier layer 160a and the third illuminant epitaxial structure 180a are electrically connected. The third illuminant epitaxial structure 180a and the second illuminant epitaxial structure 180 are connected in series via the third contact electrode 130a and the second barrier layer 160. If a current is applied to the third barrier layer 160a, the current will sequentially flow through the third illuminant epitaxial structure 180a, the third contact electrode 130a, the second barrier layer 160, the second illuminant epitaxial structure 180, the second contact electrode 130, the first barrier layer 150, the first illuminant epitaxial structure 170, and eventually flows out from the first contact electrode 110. The embodiment is intended to illustrate that the light emitting diode structure 100c is not limited to only including the first illuminant epitaxial structure 170 and the second illuminant epitaxial structure 180, but can connect a plurality illuminant epitaxial structures in series according to actual requirements. The details of related structures and operations are similar to the embodiment in FIG. 1, and thus are not described again herein.

Figure 5:
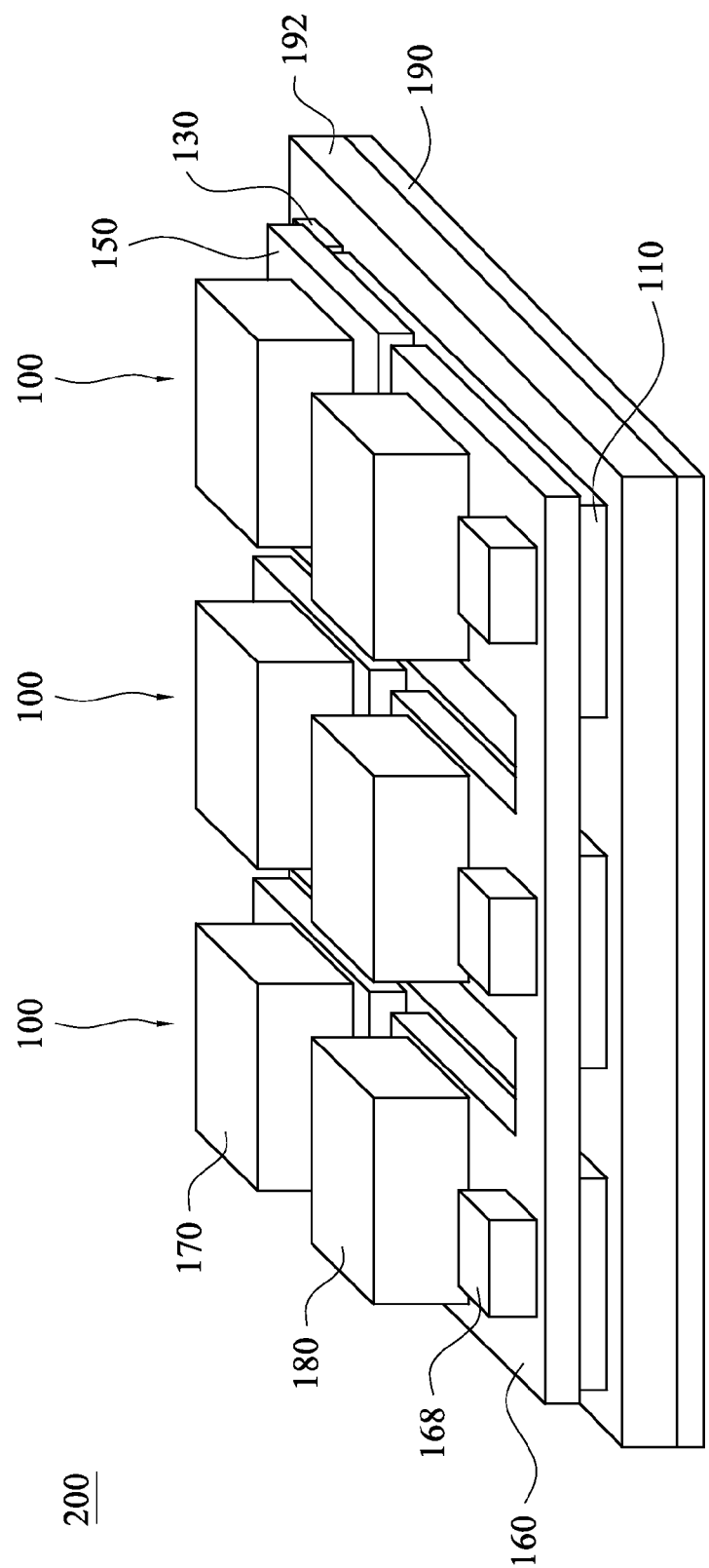
FIG. 5 is a schematic perspective view of a light emitting diode module according to an embodiment of the disclosure.

FIG. 5 is a schematic perspective view of a light emitting diode module 200 according to an embodiment of the disclosure.

As shown in FIG. 5, in the embodiment, the light emitting diode module 200 includes a plurality of the light emitting diode structures 100. The second barrier layers 160 of the light emitting diode structures 100 are connected to each other, such that the light emitting diode structures 100 form a parallel connection structure. Therefore, in the light emitting diode module 200, the illuminant epitaxial structures can be connected in series and in parallel without using wire-bonding process, and thus can provide good output power. As a result, the light emitting diode module 200 can avoid the risk caused by the wire-bonding process, thus improving production yields, and achieving a good output power to meet demands of consumers. Moreover, under the configuration that the illuminant epitaxial structures are connected in series and in parallel, the light emitting diode module 200 can be changed from high current drive to high voltage drive under the same wattage requirement. An advantage of such change is that in a high voltage application, the light emitting diode module 200 can prevent the durability of components from being limited, and lower the difficulty of designing high-current sources at application side.

Accordingly, the light emitting diode structures of the aforementioned embodiments can avoid the risk caused by the wire-bonding process and improve production yields. The light emitting diode module can further achieve a good output power to meet demands of consumers.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A light emitting diode structure, comprising:
    a first contact electrode comprising a first protruding portion;
    a first insulating layer covering the first contact electrode and exposing a top of the first protruding portion;
    a second contact electrode located on the first insulating layer and comprising a second protruding portion;
    a second insulating layer covering the second contact electrode and exposing a top of the second protruding portion;
    a first barrier layer located on the second insulating layer and electrically connected to the second contact electrode;
    a second barrier layer located on the second insulating layer;
    a first illuminant epitaxial structure located on the second insulating layer and comprising:
        a first P-type semiconductor layer covering the first barrier layer;
        a first light emitting layer; and
        a first N-type semiconductor layer, wherein the first light emitting layer and the first N-type semiconductor layer are sequentially stacked on the first P-type semiconductor layer, and a portion of the first insulating layer passes through the first P-type semiconductor layer and the light emitting layer, such that the top of the first protruding portion is located in the first N-type semiconductor layer; and
    a second illuminant epitaxial structure located on the second insulating layer and comprising:
        a second P-type semiconductor layer covering a portion of the second barrier layer;
        a second light emitting layer; and
        a second N-type semiconductor layer, wherein the second light emitting layer and the second N-type semiconductor layer are sequentially stacked on the second P-type semiconductor layer, and a portion of the second insulating layer passes through the second P-type semiconductor layer and the light emitting layer, such that the top of the second protruding portion is located in the second N-type semiconductor layer.

2. The light emitting diode structure of claim 1, further comprising a substrate and a metal bonding layer, wherein the metal bonding layer is located between the substrate and the first contact electrode.

3. The light emitting diode structure of claim 1, further comprising a first reflective layer and a second reflective layer, wherein the first reflective layer is located between the first barrier layer and the first illuminant epitaxial structure, and the second reflective layer is located between the second barrier layer and the second illuminant epitaxial structure.

4. The light emitting diode structure of claim 3, further comprising a first transparent conductive layer and a second transparent conductive layer, wherein the first transparent conductive layer is located between the first reflective layer and the first illuminant epitaxial structure, and the second transparent conductive layer is located between the second reflective layer and the second illuminant epitaxial structure.

5. The light emitting diode structure of claim 1, wherein the first N-type semiconductor layer has a first light emitting surface away from the first light emitting layer, the second N-type semiconductor layer has a second light emitting surface away from the second light emitting layer, and the first light emitting surface and the second light emitting surface are uneven surfaces.

6. The light emitting diode structure of claim 1, further comprising a first isolation layer and a second isolation layer, wherein the first illuminant epitaxial structure has a first channel passing through the first P-type semiconductor layer and the first light emitting layer, the first isolation layer entirely covers an inner sidewall of the first channel, the second illuminant epitaxial structure has a second channel passing through the second P-type semiconductor layer and the second light emitting layer, and the second isolation layer entirely covers an inner sidewall of the second channel.

7. The light emitting diode structure of claim 1, further comprising a first bonding pad, the second barrier layer further comprising an extending portion, wherein the first bonding pad is electrically connected to and located on the extending portion.

8. The light emitting diode structure of claim 7, further comprising a protective layer, wherein the protective layer covers the first illuminant epitaxial structure, the second illuminant epitaxial structure, and the second barrier layer and exposes at least a portion of the first bonding pad.

9. The light emitting diode structure of claim 1, further comprising a first bonding pad and a second bonding pad, the second barrier layer further comprising an extending portion, wherein the first bonding pad is electrically connected to and located on the extending portion, and the second bonding pad is electrically connected to and located on the first contact electrode.

10. A light emitting diode module, comprising:
a plurality of light emitting diode structures which each is of claim 1, wherein the second barrier layers of the light emitting diode structures are connected to each other, such that the light emitting diode structures form a parallel connection structure.

\* \* \* \* \*